(12) United States Patent
Ozaki et al.

(10) Patent No.: US 7,863,741 B2
(45) Date of Patent: Jan. 4, 2011

(54) SEMICONDUCTOR CHIP AND MANUFACTURING METHOD THEREOF

(75) Inventors: Hiroshi Ozaki, Saitama (JP); Satoru Wakiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 111 days.

(21) Appl. No.: 12/078,893

(22) Filed: Apr. 8, 2008

(65) Prior Publication Data
US 2008/0277784 A1    Nov. 13, 2008

(30) Foreign Application Priority Data
May 7, 2007    (JP)    ............................. 2007-122156

(51) Int. Cl.
  H01L 23/48    (2006.01)
  H01L 23/52    (2006.01)
  H01L 29/40    (2006.01)
(52) U.S. Cl. ................. 257/737; 257/738; 257/E23.068
(58) Field of Classification Search ................. 257/737, 257/738; 438/613
See application file for complete search history.

(56) References Cited
U.S. PATENT DOCUMENTS

| 5,131,582 | A  | * | 7/1992  | Kaplan et al. | ............... | 228/121 |
| 6,819,002 | B2 | * | 11/2004 | Chen et al.   | ................. | 257/779 |
| 2006/0141671 | A1 | * | 6/2006 | Houle et al. | ................ | 438/122 |

FOREIGN PATENT DOCUMENTS

| JP | 2697116    | 9/1997  |
| JP | 2000-349123 | 12/2000 |

* cited by examiner

Primary Examiner—Phat X Cao
Assistant Examiner—Nga Doan
(74) Attorney, Agent, or Firm—Rader, Fishman & Grauer PLLC

(57) ABSTRACT

A semiconductor chip formed with a bump such that the bump corresponds to a pad electrode. The pad electrode is covered with a nickel layer. The bump has an indium layer and an intermediate metal compound layer disposed between the indium layer and the nickel layer, and the intermediate metal compound layer is formed by alloying the indium layer and a copper layer containing copper atoms of not less than 0.5 atomic percent and not more than 5 atomic percent with respect to the indium atoms in the indium layer.

2 Claims, 14 Drawing Sheets

SEMICONDUCTOR CHIP AND MANUFACTURING METHOD THEREOF

BACKGROUND OF THE INVENTION

1. Field of the Invention

The present invention relates to a semiconductor chip and a manufacturing method thereof. In particular, the present invention relates to a semiconductor chip in which a bump is formed correspondingly to a pad electrode, and a method of manufacturing the semiconductor chip.

2. Description of Related Art

Instead of a wire bonding method, a face-down method is applied for densely mounting a semiconductor chip. In the face down method, the bump formed correspondingly to the pad electrode of the semiconductor chip is thermally compressed onto a terminal of a wiring board (for example, refer to Japanese Patent No. 2697116, Patent Document 1, and Japanese Unexamined Patent Application Publication No. 2000-349123, Patent Document 2).

Specifically, the bump is formed on a substrate surface of the semiconductor chip such that the bump corresponds to the pad electrode provided on the substrate surface. The substrate surface on which the bump is formed is faced downward so as to be supported by a bonding head of a bonding apparatus. Then, the wiring board is supported on the bonding apparatus so that the surface provided with the terminal, on which the semiconductor chip is mounted, faces the supported semiconductor chip. Thereafter, the bump of the semiconductor chip and the terminal of the wiring board are aligned such that they correspond to each other, and the bump is then thermally bonded to the terminal. For example, when the solder bump is in the molten state, both are bonded to each other by a fluxless connection in which the bonding head is moved vertically in the facing direction and/or moved laterally in the planar direction.

SUMMARY OF THE INVENTION

FIG. 14 shows schematically in section parts of a semiconductor chip 101 in which a bump 121 is formed on a pad electrode 111.

As shown in FIG. 14, the semiconductor chip 101 has a pad electrode 111 and a bump 121. For example, a titanium layer 112, a copper layer 113 and a nickel layer 114 are sequentially laminated on the pad electrode 111 to cover the surface the electrode. The nickel layer 114 is formed in a thickness of 3 to 5 μm by an electrolytic plating method or the like. The bump 121 includes an indium layer 122, and an intermediate metal compound layer 123 formed of an indium-nickel alloy layer is interposed between the indium layer 122 and the nickel layer 114.

The intermediate metal compound layer 123 formed of the indium-nickel alloy layer is fabricated by alloying the indium layer 122 and the nickel layer 114. For example, when the indium layer 122 is reflowed by heat treatment at a temperature of 200° C. or below for 15 seconds, in order to handle a semiconductor chip having a low heat resistance temperature, the intermediate metal compound layer 123 as $In_7Ni_3$ having a thickness of 0.1 μm to 0.2 μm is formed.

However, when the semiconductor chip 101 is mounted on the wiring board by the face down method, a break may occur in the intermediate metal compound layer 123. This may lower the reliability of the semiconductor device manufactured by mounting the semiconductor chip on the wiring board.

Particularly, when the reflow is carried out at a heat resistant temperature as low as 200° C. or lower, the $In_7Ni_3$ can be formed in a thickness of merely 0.1 μm to 0.2 μm, as described above. Therefore, the occurrence of the disadvantage may become prominent. This disadvantage may become more prominent in the mounting process by fluxless bonding.

The Patent Document 1 discloses the method of forming an indium solder bump. That is, the document discloses the formation of a platinum layer as a barrier metal on a chromium or titanium base layer, for the purpose of suppressing indium alloy growth. Thus, platinum is used only as a diffusion protection film with respect to indium and chromium or titanium, making it difficult to attain alloy growth between indium and platinum. Therefore, indium and platinum may be separated from each other, particularly in the fluxless bonding. In addition to this, due to variations in the film thickness and the composition of the platinum layer, it becomes difficult to control the composition and the thickness of an alloy to be generated. Particularly, when an alloy having a plurality of compositions is generated, cracks may occur in the alloy, resulting in the lowering of reliability. Additionally, platinum plating is expensive, making it difficult to achieve cost reductions.

Hence, in some cases it has been difficult to achieve a high reliability in the semiconductor chip mounting.

It is desirable to provide a semiconductor chip and a method of manufacturing thereof which allow a precise mounting of a semiconductor chip as well as an improvement of reliability.

The semiconductor chip of an embodiment of the present invention is a semiconductor chip having a bump which is formed such that it corresponds to a pad electrode. The pad electrode is covered with a nickel layer. The bump has an indium layer and an intermediate metal compound layer disposed between the indium layer and the nickel layer. The intermediate metal compound layer is formed by alloying the indium layer and a copper layer containing copper atoms of not less than 0.5 atomic percent and not more than 5 atomic percent with respect to the indium atoms in the indium layer.

Preferably, the nickel layer is formed on the pad electrode such that the thickness of the layer becomes not more than 0.5 μm.

The method of manufacturing a semiconductor chip of the present invention is a method of manufacturing a semiconductor chip in which a bump is formed such that it corresponds to a pad electrode, and includes a nickel layer forming step of forming a nickel layer so as to cover the pad electrode and a bump forming step of forming the bump such that the bump corresponds to the pad electrode covered with the nickel layer. The bump forming step includes a copper layer forming step of forming a copper layer on the nickel layer, an indium layer forming step of forming an indium layer on the copper layer, and a heat treatment step of forming the bump by performing heat treatment such that the copper layer and the indium layer are alloyed to form an intermediate metal compound layer. In the copper layer forming step, the copper layer is formed so that the ratio of copper atoms in the copper layer with respect to indium atoms in the indium layer formed in the indium layer forming step becomes not less than 0.5 atomic percent and not more than 5 atomic percent.

Preferably, in the nickel layer forming step, the nickel layer is formed in a thickness of not more than 0.5 μm on the pad electrode.

Preferably, in the nickel layer forming step, the nickel layer is formed by sputtering nickel by a sputtering method.

Preferably, in the copper layer forming step, the copper layer is formed by plating copper onto the nickel layer by electrolyte plating, and in the indium layer forming step, the indium layer is formed by plating indium onto the copper layer by electrolyte plating.

Thus, the shear intensity of the intermediate metal compound layer is improved by forming the layer by alloying the indium layer and the copper layer containing copper atoms of not less than 0.5 atomic percent and not more than 5 atomic percent with respect to the indium atoms in the indium layer.

The semiconductor chip in an embodiment of the present invention is a semiconductor chip having a bump formed such that the bump corresponds to the pad electrode. The pad electrode is covered with a nickel layer. The bump has an indium layer and an intermediate metal compound layer disposed between the indium layer and the nickel layer. The intermediate metal compound layer is an indium-nickel alloy layer formed in a thickness of 1 μm or more by alloying the indium layer and the nickel layer such that the layer includes $In_7Ni_3$.

The method of manufacturing a semiconductor chip of an embodiment of the invention is a method of manufacturing a semiconductor chip in which a bump is formed such that the bump corresponds to a pad electrode, and the method includes a nickel layer forming step of forming a nickel layer so as to cover the pad electrode and a bump forming step of forming the bump correspondingly to the pad electrode covered with the nickel layer. The bump forming step includes an indium layer forming step of forming an indium layer on the nickel layer and a heat treatment step of forming the bump by performing heat treatment by alloying the indium layer and the nickel layer into an indium-nickel alloy layer including $In_7Ni_3$ having a thickness of 1 μm or more, to obtain an intermediate metal compound layer.

Preferably, the heat treatment step includes a first heat treatment step of performing heat treatment such that the indium layer may be reflowed and a second heat treatment step of performing heat treatment so that the indium layer and the nickel layer may be alloyed to produce $In_7Ni_3$ after reflowing the indium layer.

Preferably, in the second heat treatment step, the heat treatment is performed at a temperature of 156° C. or higher and less than 400° C.

In the present invention, the indium layer and the nickel layer are alloyed to form the indium-nickel alloy layer having a thickness of 1 μm or more and including $In_7Ni_3$, whereby the shear intensity of the indium-nickel alloy layer is improved.

Accordingly, the present invention can provide the semiconductor chip and the method of manufacturing thereof which allow a precise mounting of the semiconductor chip as well as an improvement of reliability.

DETAILED DESCRIPTION OF THE EMBODIMENTS

Embodiments of the present invention will be described below with reference to the accompanying drawings.

First Embodiment

Configuration

Figure 1:
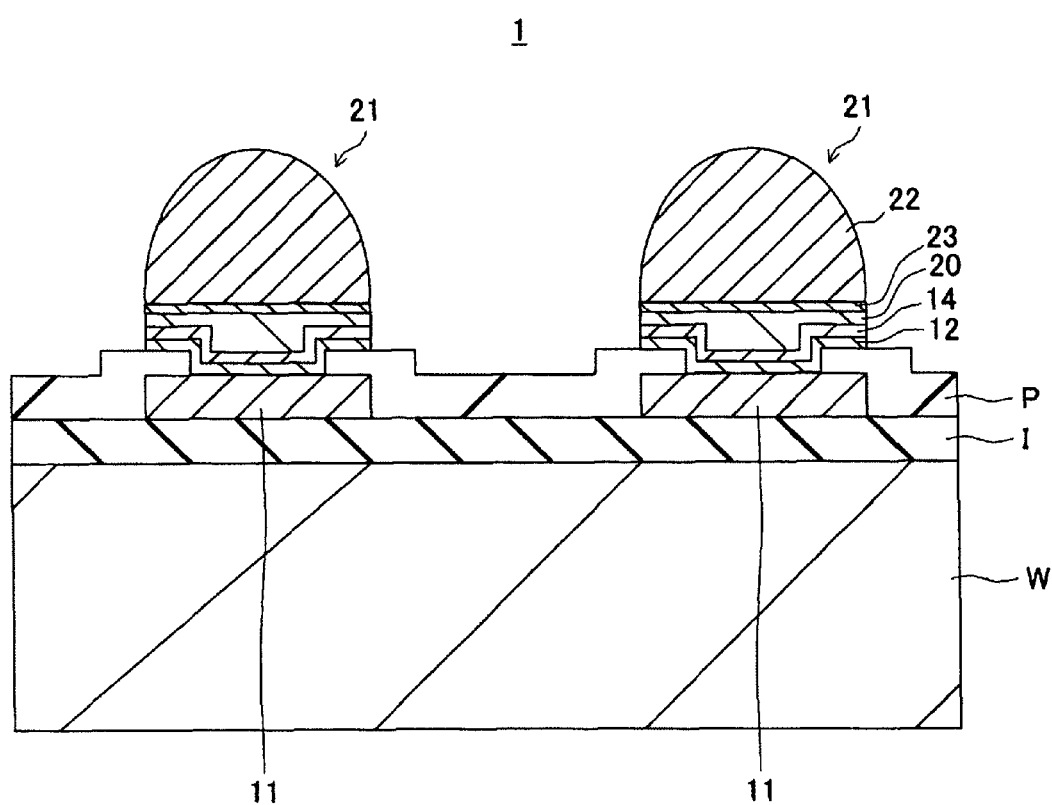
FIG. 1 is a sectional view showing parts of a semiconductor chip in which a bump is formed on a pad electrode in a semiconductor chip according to a first embodiment of the present invention.

FIG. 1 is a sectional view showing parts of a semiconductor chip 1 in which a bump 21 is formed on a pad electrode 11 according to a first embodiment of the present invention.

As shown in FIG. 1, the semiconductor chip 1 has the pad electrode 11 and the bump 21, and the bump 21 is formed such that it corresponds to the pad electrode 11. A titanium layer 12 and a nickel layer 14 are sequentially laminated on the pad electrode 11 so as to cover the surface thereof. The bump 21 includes an indium layer 22 and an intermediate metal compound layer 23, composed of an indium-copper alloy layer interposed between the indium layer 22 and the nickel layer 14.

The respective components will be described sequentially.

The pad electrode 11 is made of, for example, aluminum and connected via an interlayer insulating film I to an electric circuit (not shown) formed on a wafer W of the semiconductor chip 1. As shown in FIG. 1, the surface of the pad electrode 11 is circumferentially covered with a passivation film P, and the titanium layer 12 and the nickel layer 14 are sequentially formed at the middle part of the surface of the pad electrode 11.

The titanium layer 12 is formed so as to cover the middle part of the pad electrode 11, as shown in FIG. 1. For example, the titanium layer 12 may be formed on the surface of the pad electrode 11 by sputtering titanium into a film by a sputtering method.

The nickel layer 14 is formed so as to cover the middle part of the pad electrode 11 with the titanium layer 12 in between, as shown in FIG. 1. For example, the nickel layer 14 can be formed by sputtering nickel into a film by a sputtering method. In the present embodiment, the nickel layer 14 is formed in a thickness of 0.5 μm or less.

The bump 21 has the indium layer 22 and the intermediate metal compound layer 23, and protruding beyond the surface of the wafer W with the pad electrode 11 formed thereon, as shown in FIG. 1.

The indium layer 22 overlies the nickel layer 14 with the intermediate metal compound layer 23 in between, as shown in FIG. 1. The indium layer 22 is formed in a spherical shape.

The intermediate metal compound layer 23 is formed between the indium layer 22 and the nickel layer 14, as shown in FIG. 1. The details will be described later. In the present embodiment, the intermediate metal compound layer 23 is an indium-copper alloy layer, formed by alloying the indium layer 22 and a copper layer 20 containing copper atoms of not less than 0.5 atom percent and not more than 5 atom percent with respect to the indium atoms in the indium layer 22.

<Manufacturing Method>

The key parts of the method of manufacturing the semiconductor chip 1 in the first embodiment will be described below.

Figure 2A:
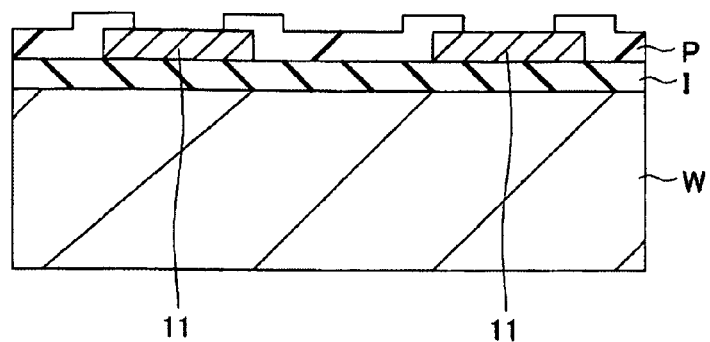
FIGS. 2A to 2D are sectional views showing the sections of key parts of the semiconductor chip to be manufactured in each step in the first embodiment of the present invention.
Figure 2B:
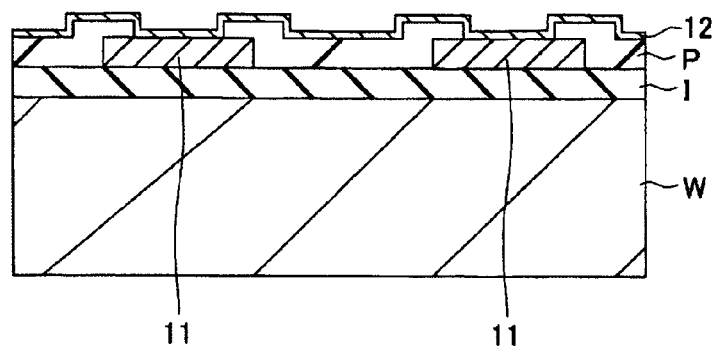
Figure 2C:
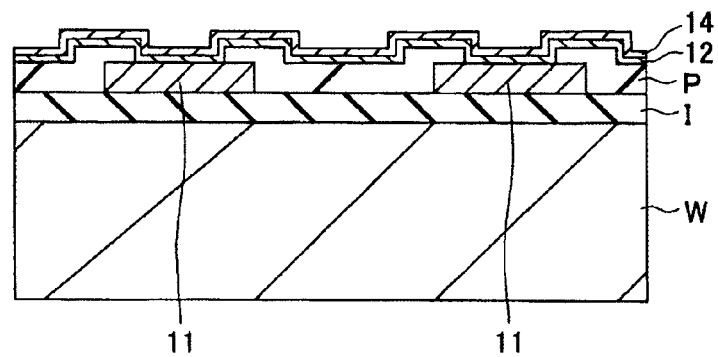
Figure 2D:
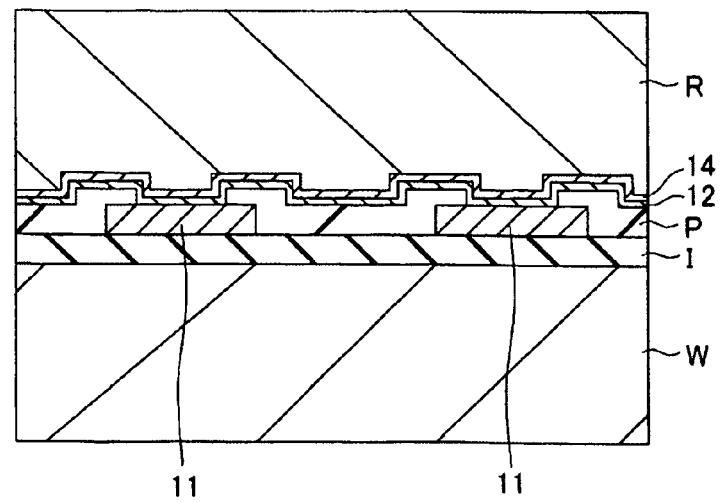
Figure 3A:
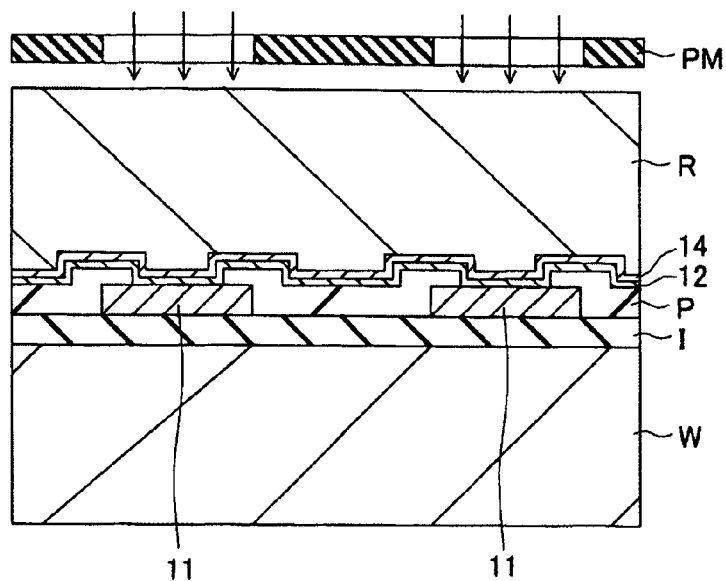
FIGS. 3A to 3C are sectional views showing the sections of key parts of the semiconductor chip to be manufactured in each step in the first embodiment.
Figure 3B:
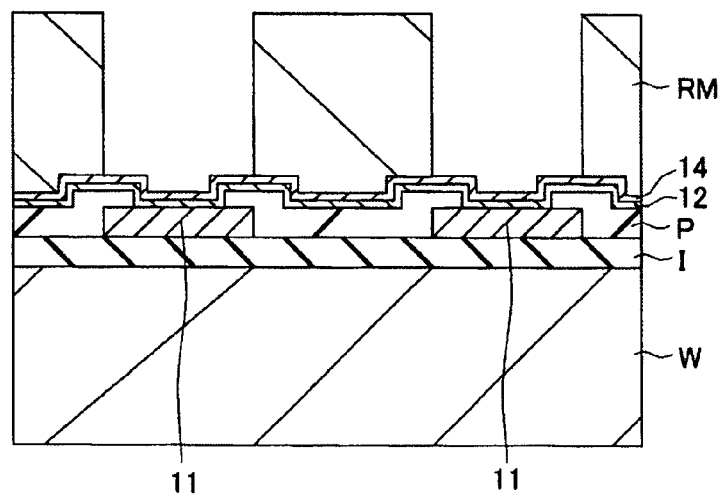
Figure 3C:
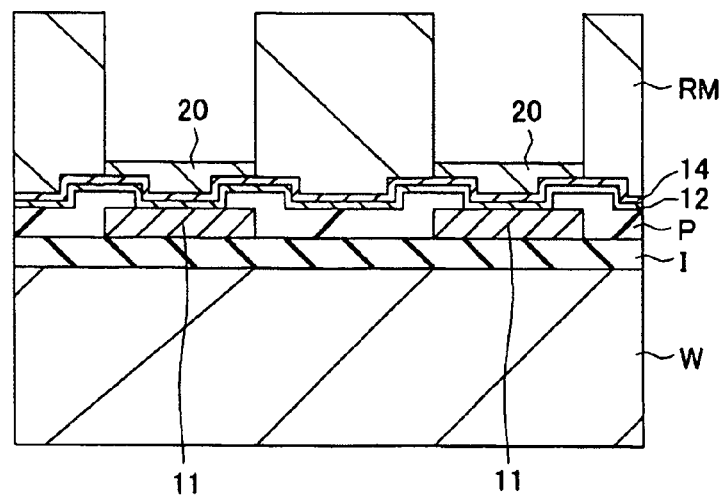
Figure 4A:
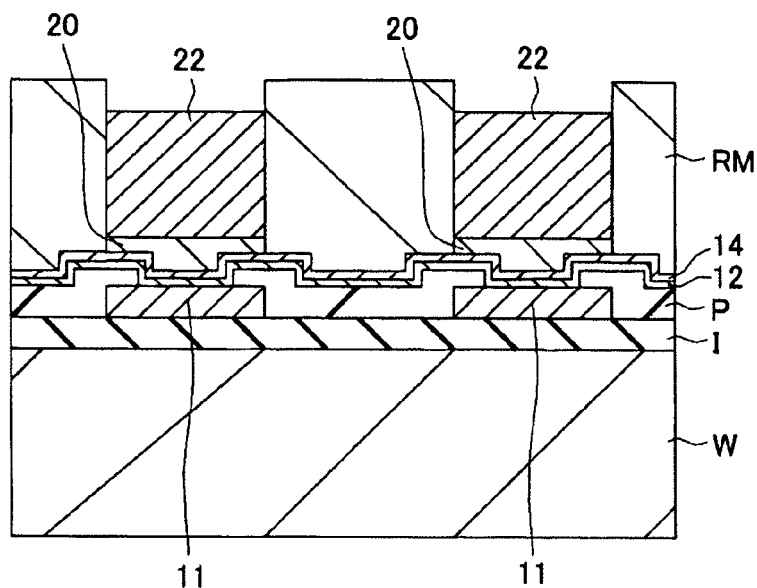
FIGS. 4A to 4C are sectional views showing the sections of key parts of the semiconductor chip to be manufactured in each step in the first embodiment.
Figure 4B:
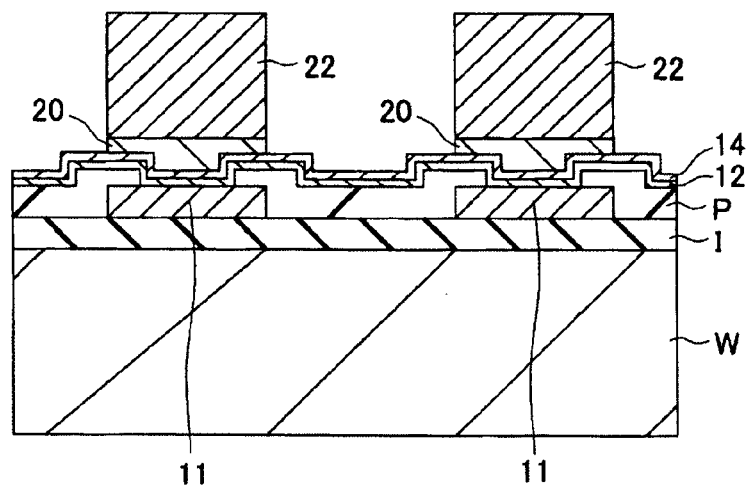
Figure 4C:
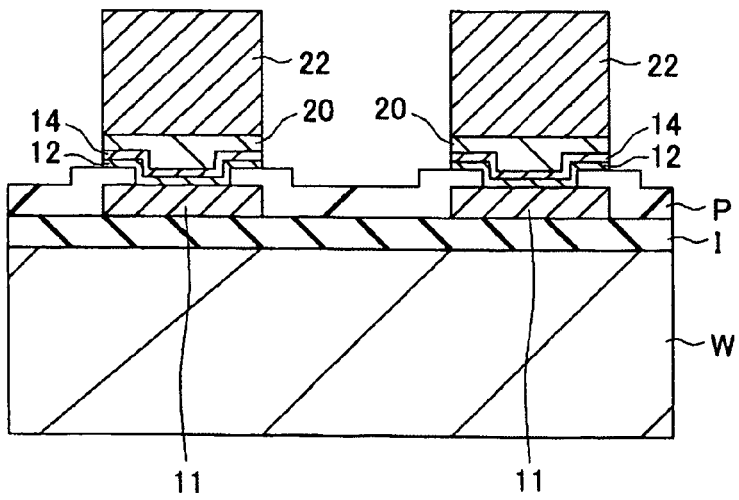

FIG. 2, FIG. 3, and FIG. 4 are sectional views showing the sections of key parts of the semiconductor chip 1 manufactured in each step in the first embodiment of the present invention. That is, the semiconductor chip 1 shown in FIG. 1 is manufactured by performing sequentially the manufacturing steps in FIGS. 2A to 2D, FIGS. 3A to 3C and FIGS. 4A to 4C.

A wafer W is prepared as shown in FIG. 2A.

The wafer W on whose principal surface a pad electrode 11 and a passivation film P are formed with an interlayer insulating film I in between is prepared. In the wafer W, the pad electrode 11 is formed by, for example, a metal film, such as an aluminum film. The passivation film P is formed by an insulating film, such as a silicon oxide film, and covers in the vicinity of the pad electrode 11. Apertures are formed such that the middle parts of the pad electrode 11 are exposed. Thereafter, inverse sputtering is performed to remove a natural oxide film.

A titanium layer 12 is formed as shown in FIG. 2B.

The titanium layer 12 is formed by sputtering titanium by a sputtering method so as to cover the surface of the wafer W, including the surface exposed at the pad electrode 11.

A nickel layer 14 is formed as shown in FIG. 2C.

The nickel layer 14 is formed by sputtering nickel by a sputtering method so as to cover the surface of the wafer W, including the surface exposed at the pad electrode 11. For example, the nickel layer 14 is formed in a thickness of not more than 0.5 μm.

A photoresist film R is applied as shown in FIG. 2D.

A film is formed by applying the photo resist film R by a spin coat method such that a surface of the wafer W is covered. Specifically, a coating solution including a photosensitive material is applied such that the surface of the wafer W is covered to form a film. The film is then dried to form the photo resist film R. For example, the photo resist film R is formed in a thickness of 50 to 100 μm.

Subsequently, the exposure process of the photo resist film R is performed as shown in FIG. 3E.

Using a photo mask PM, exposure light is irradiated to the portion of the photo resist film R corresponding to the region where a bump 21 is formed and where the pad electrode 11 is formed on the wafer W.

The development process of the photoresist film R is performed to form a resist mask layer RM, as shown in FIG. 3F.

By performing the development process to the photoresist film R, the region of the photoresist film R, to which the exposure light is irradiated, is removed to form the resist mask layer RM. Specifically, apertures are formed in a manner in which they correspond to portions where the bump 21 is formed in the photoresist film R so that the middle part of the pad electrode 11 is exposed. Thereafter, resist descum processing is performed.

Subsequently, a copper layer 20 is formed as shown in FIG. 3G.

The copper layer 20 is formed by performing plating with copper by an electrolytic plating method to the middle part of the pad electrode 11 exposed at the aperture of the resist mask layer RM. In the present embodiment, the copper layer 20 is formed so that the ratio of copper atoms in the copper layer 20 is not less than 0.5 atomic percent and not more than 5 atomic percent with respect to the indium atoms in an indium layer 22 to be formed in the following step. For example, the copper layer 20 is formed in a thickness of 0.1 μm.

The indium layer 22 is formed as shown in FIG. 4A.

The indium layer 22 is formed by performing electrolytic indium plating to the middle part of the pad electrode 11 exposed at the aperture of the resist mask layer RM. In the present embodiment, as described above, the indium layer 22 is formed so that the ratio of copper atoms in the copper layer 20 becomes not less than 0.5 atomic percent and not more than 5 atomic percent with respect to the indium atoms in the indium layer 22. For example, the indium layer 22 is formed in a thickness of 10 μm. In this case, 1 atomic percent of the copper atoms of the copper layer 20 is contained with respect to the indium atoms of the indium layer 22. When the ratio of the copper atoms of the copper layer 20 with respect to the indium atoms of the indium layer 22 is below 0.5 atomic percent, it is not preferable because it is probable that, besides indium-copper alloying, indium-nickel alloying may be advanced. On the other hand, if the ratio of the copper atoms of the copper layer 20 with respect to the indium atoms of the indium layer 22 exceeds 5 atomic percent, it is not preferable because it is probable that the melting point is raised, whereby the indium-copper alloying is blocked.

The resist mask layer RM is then removed as shown in FIG. 4B.

That is, the resist mask layer RM is removed to expose the nickel layer 14 that has been covered with the resist mask layer RM.

Subsequently, the nickel layer 14 and the titanium layer 12 are removed as shown in FIG. 4C.

For example, the portion exposed on the surface of the nickel layer 14 is removed by etching using the indium layer 22 as a hard mask. Similarly, the portion exposed on the surface of the titanium layer 12 is then removed by etching.

Subsequently, a reflow process is performed to complete the semiconductor chip 1, as shown in FIG. 1.

That is, heat treatment is performed in a manner in which the indium layer 22 may be reflowed spherically and the copper layer 20 and the indium layer 22 may be alloyed for generating an intermediate metal compound layer 23, so that the bump 21 may be formed.

Specifically, the heat treatment is carried out under the following conditions;

Heat treatment temperature: 180° C.
Heat treatment time: 15 seconds

Thus, in the present embodiment, after the nickel layer 14 is formed so as to cover the pad electrode 11, the bump 21 is formed correspondingly to the pad electrode 11 covered by the nickel layer 14. In this case, the copper layer 20 is firstly formed on the nickel layer 14, and the indium layer 22 is then formed on the copper layer 20. Thereafter, the bump 21 is formed by performing heat treatment such that the copper layer 20 and the indium layer 22 are alloyed to generate the intermediate metal compound layer 23. At this time, the copper layer 20 is formed so that the ratio of copper atoms in the copper layer 20 is not less than 0.5 atomic percent and not more than 5 atomic percent with respect to the indium atoms in the indium layer 22. That is, in accordance with the present embodiment, the copper layer 20 and the indium layer 22 are formed at the ratio which enables suitable alloying.

In the present embodiment, instead of a brittle indium-nickel alloy layer, an indium-copper alloy layer less brittle than the indium-nickel alloy layer is employed for forming the intermediate metal compound layer 23. By disposing the intermediate metal layer 23 between the indium layer 22 and the nickel layer 14, the embodiment is capable of preventing a crack to be caused in the intermediate metal compound layer 23 when the semiconductor chip 1 manufactured as above is mounted by the face down method. Specifically, the shear intensity of the bump 21 formed in the present embodiment is measured and compared with that in the related art case, and as a result, the former had a shear intensity approximately four to five times greater than the latter.

Hence, the present embodiment can improve the reliability of the semiconductor device manufactured by mounting the semiconductor chip 1 on the wiring board.

Additionally, the nickel layer 14 is formed in a thickness of not more than 0.5 μm on the pad electrode 11. That is, the nickel layer 14 may be formed in a thin film because the nickel layer 14 is not alloyed with the indium layer in the present embodiment. This enables the nickel layer 14 to be formed in a thin film by a sputtering method. Thus, the indium bump containing copper has a melting point of 220° C. or less, which is lower than the melting point of Sn-based lead-free solder, thereby permitting low temperature bonding. Hence, the present embodiment is applicable to any semiconductor chip having a low heat resistant temperature, and a high level of general versatility. These enable efficient manufacturing of the semiconductor chips.

Second Embodiment

A second embodiment of the invention will be described below.

<Configuration>

Figure 5:
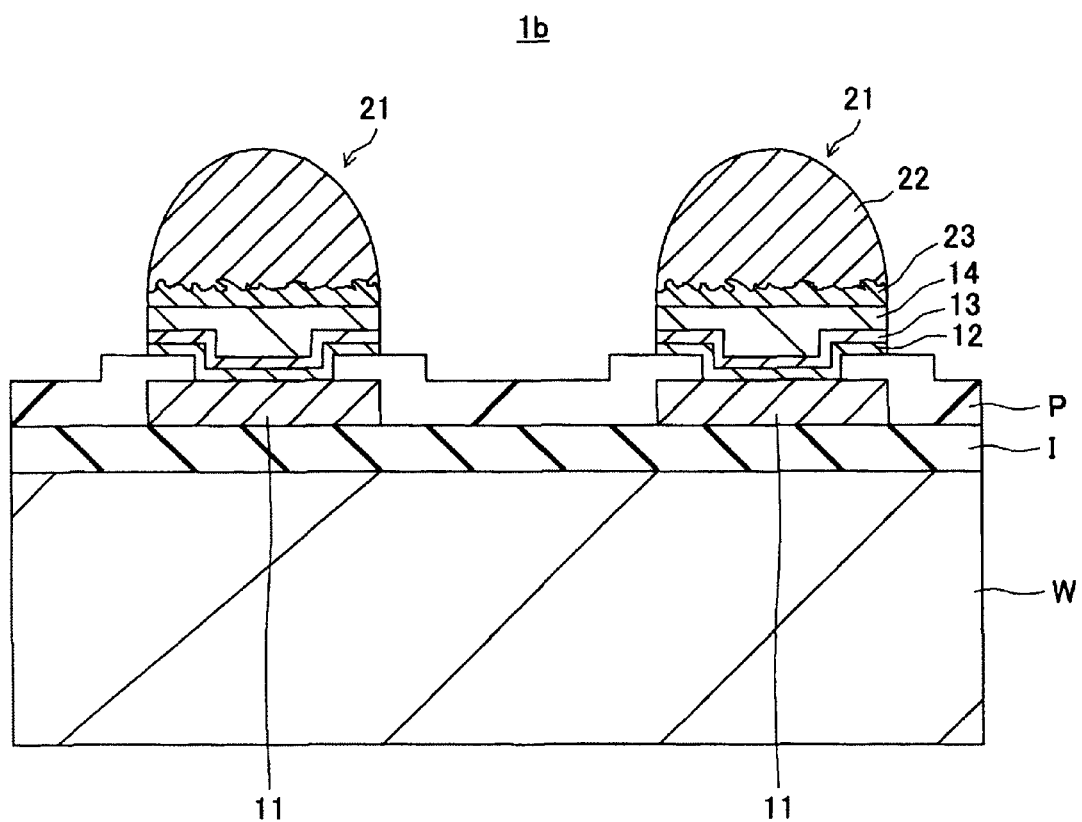
FIG. 5 is a sectional view showing parts of a semiconductor chip in which a bump is formed on a pad electrode in a semiconductor chip according to a second embodiment of the invention.

FIG. 5 is a sectional view showing parts of a semiconductor chip 1b in which a bump 21 is formed on a pad electrode 11 according to the second embodiment of the present invention.

As shown in FIG. 5, similarly to the first embodiment, the semiconductor chip 1b has the pad electrode 11 and the bump 21. Bump 21 is formed correspondingly to the pad electrode 11. A titanium layer 12, a copper layer 13, and a nickel layer 14 are sequentially laminated on the pad electrode 11 so as to cover the surface thereof. The bump 21 includes an indium layer 22, and an intermediate metal compound layer 23 is interposed between the indium layer 22 and the nickel layer 14.

In the semiconductor chip 1b of the second embodiment, the copper layer 13 underlies the nickel layer 14, and the nickel layer 14 has a thickness different from that in the first embodiment. Also, the intermediate metal compound layer 23 has a composition different from that of the first embodiment. Excluding the above, the second embodiment is similar to the first embodiment, and the descriptions of overlapping sections are omitted here.

The respective components will be described sequentially.

Similarly to the first embodiment, the pad electrode 11 is made of, for example, aluminum and connected to an electric circuit (not shown) formed on the semiconductor chip 1b. As shown in FIG. 5, the titanium layer 12, the copper layer 13 and the nickel layer 14 are sequentially formed on the surface of the pad electrode 11.

Similarly to the first embodiment, the titanium layer 12 is formed so as to cover the pad electrode 11.

The copper layer 13 is formed so as to cover the pad electrode 11 with the titanium layer 12 in between, as shown in FIG. 5. For example, the copper layer 13 is formed by sputtering copper by a sputtering method.

The nickel layer 14 is formed so as to cover the pad electrode 11 with the titanium layer 12 and the copper layer 13 in between, as shown in FIG. 5. For example, the nickel layer 14 is formed on the surface of the pad electrode 11 by sputtering nickel by a sputtering method. In the present embodiment, for example, the nickel layer 14 is formed in a thickness of 3 to 5 μm.

The bump 21 has the indium layer 22 and the intermediate metal compound layer 23, and protruding from the surface of a wafer W on which the pad electrode 11 is formed in the semiconductor chip 1b, as shown in FIG. 5.

The indium layer 22 is formed such that it sandwiches the intermediate metal compound layer 23 with nickel layer 14, as shown in FIG. 5. For example, the indium layer 22 has a height of 10 μm, and is formed in a manner in which it becomes a spherical shape by being reflowed.

The intermediate metal compound layer 23 is disposed between the indium layer 22 and the nickel layer 14, as shown in FIG. 5. The details thereof will be described later. In the present embodiment, the intermediate metal compound layer 23 is formed by alloying the indium layer 22 and the nickel layer 14. Specifically, the intermediate metal compound layer 23 is an indium-nickel alloy layer in which the indium layer and the nickel layer are alloyed to include $In_7Ni_3$, and the indium-nickel alloy layer has a thickness of not less than 1 μm. Alternatively, the $In_7Ni_3$ may be an alloy having a composition ratio of $In_{27}Ni_{10}$, $In_{6.4}Ni_3$ or $In_{27}Ni_{28}$.

<Manufacturing Method>

The key parts of the method of manufacturing the semiconductor chip 1b in the second embodiment of the present invention will be described below.

Figure 6A:
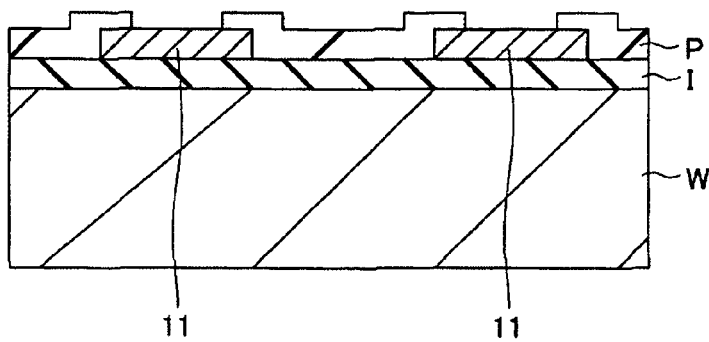
FIGS. 6A to 6D are sectional views showing the sections of key parts of a semiconductor chip to be manufactured in each step in the second embodiment of the present invention.
Figure 6B:
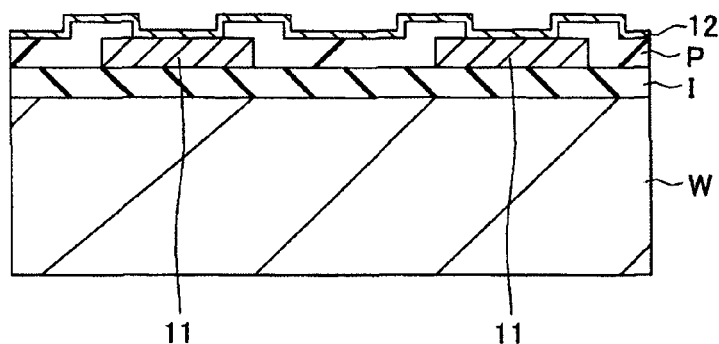
Figure 6C:
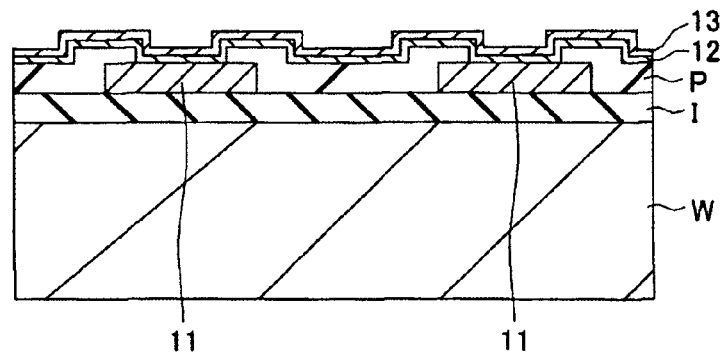
Figure 6D:
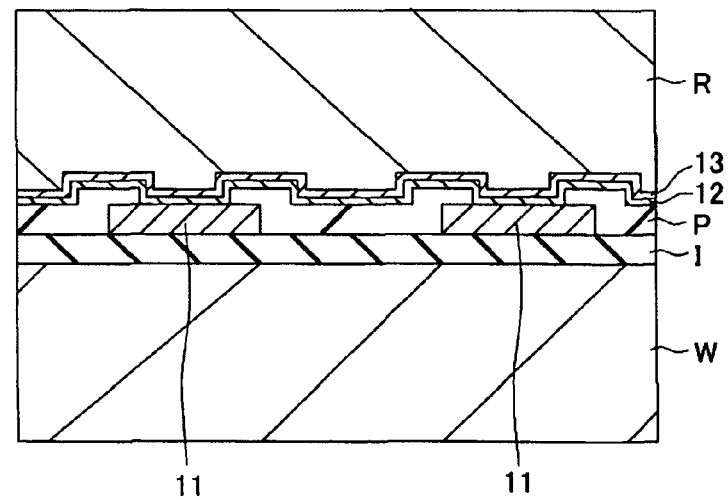
Figure 7A:
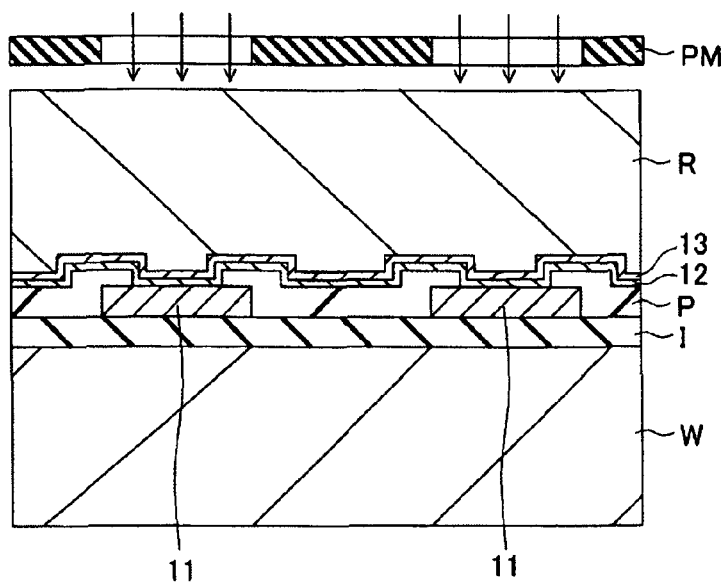
FIGS. 7A to 7C are sectional views showing the sections of key parts of the semiconductor chip to be manufactured in each step in the second embodiment of the present invention.
Figure 7B:
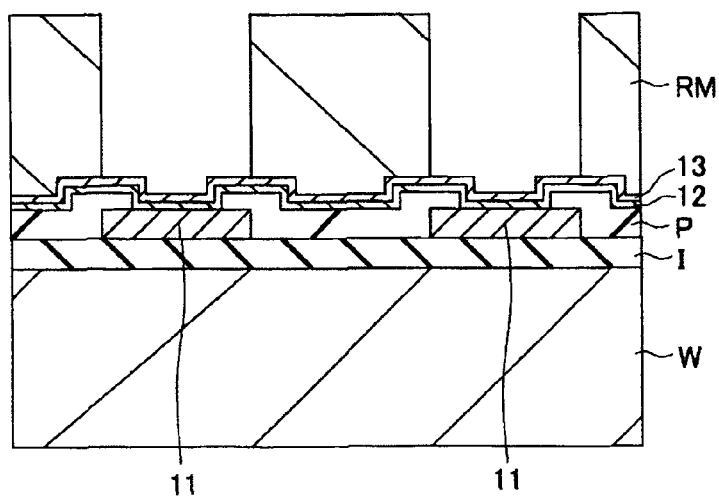
Figure 7C:
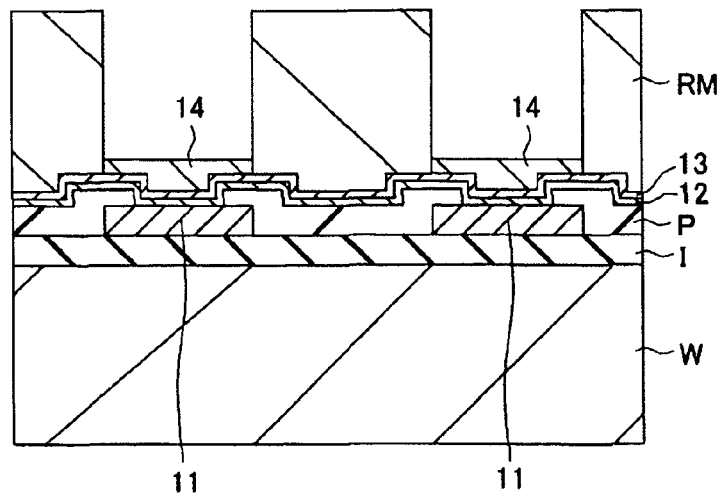
Figure 8A:
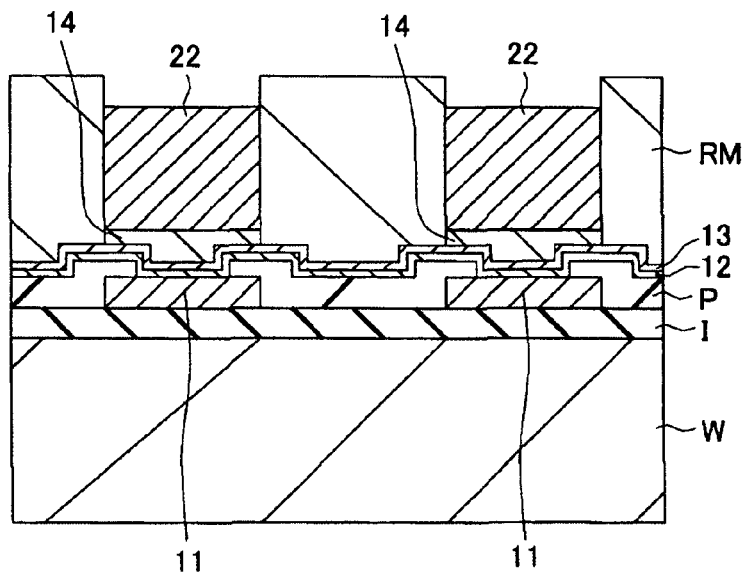
FIGS. 8A to 8C are sectional views showing the sections of key parts of the semiconductor chip to be manufactured in each step in the second embodiment of the present invention.
Figure 8B:
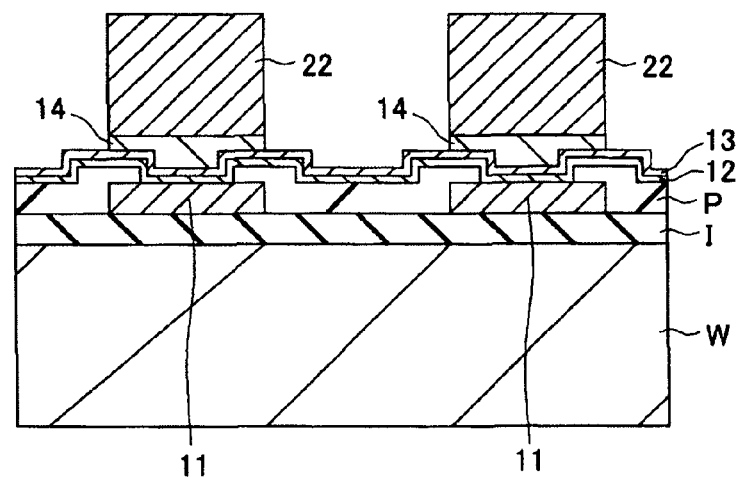
Figure 8C:
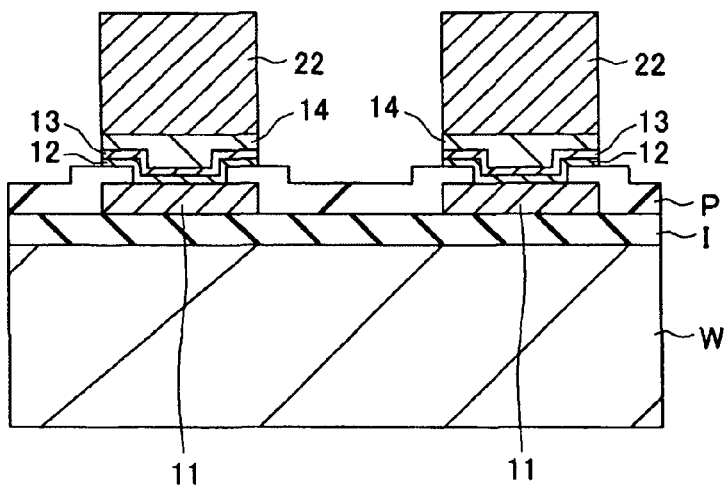

FIG. 6, FIG. 7, and FIG. 8 are sectional views showing the sections of key parts of the semiconductor chip 1b to be manufactured in each step in the second embodiment of the present invention. That is, the semiconductor chip 1b shown in FIG. 5 can be manufactured by performing sequentially the manufacturing steps in the order from FIGS. 6A to 6D, FIGS. 7A to 7C and FIGS. 8A to 8C, which show sections of key parts of a device to be manufactured in each step.

Similarly to the first embodiment, a wafer W is prepared as shown in FIG. 6A, and thereafter, a titanium layer 12 is formed as shown in FIG. 6B.

A copper layer 13 is formed as shown in FIG. 6C.

The copper layer 13 is formed by sputtering copper by a sputtering method so as to cover the surface of the wafer W, including the surface exposed at the pad electrode 11.

Similarly to the first embodiment, a photoresist film R is applied as shown in FIG. 6D, and the exposure process is performed on the photoresist film R as shown in FIG. 7A. Thereafter, the development process is performed on the photoresist film R to form a resist mask layer RM, as shown in FIG. 7B.

A nickel layer 14 is formed as shown in FIG. 7C.

The nickel layer 14 is formed by performing electrolytic nickel plating to the middle part of the pad electrode 11 exposed at an aperture of the resist mask layer RM. In the present embodiment, the nickel layer 14 is formed in a thickness of 3 to 5 μm.

Similarly to the first embodiment, the indium layer 22 is formed as shown in FIG. 8A. After the resist mask layer RM is removed as shown in FIG. 8B, the copper layer 13 and the titanium layer 12 are removed as shown in FIG. 8C.

For example, the portion exposed on the surface of the copper layer 13 is removed by etching using the indium layer 22 as a hard mask. Similarly, the portion exposed on the surface of the titanium layer 12 is then removed by etching.

Subsequently, a reflow process is performed to complete the semiconductor chip 1b, as shown in FIG. 5.

That is, heat treatment is performed in a manner in which the indium layer 22 is reflowed into a spherical shape and the nickel layer 14 and the indium layer 22 are alloyed for generating an intermediate metal compound layer 23, so that a bump 21 may be formed. Specifically, the heat treatment is carried out at a temperature ranging from 156° C. or above to below 400° C.

Further, in the present embodiment, heat treatment is carried out in a manner in which the indium layer 22 and the nickel layer 14 are alloyed into an indium-nickel alloy layer including $In_7Ni_3$ having a thickness of 1 μm or above, so that the intermediate metal compound layer 23 may be generated. That is, the heat treatment is carried out to further increase the thickness of the $In_7Ni_3$. The $In_7Ni_3$ is grown to a height lower than that of the indium solder. That is, the heat treatment is performed such that the unalloyed portions may be included in the indium layer 22.

Specifically, the heat treatment is carried out under the following conditions;

Heat treatment temperature: ranging from 156° C. or above to below 400° C.

Heat treatment time: not less than 60 minutes

After the bump 21 is thus formed on the semiconductor chip 1b, the semiconductor chip 1b is mounted.

That is, the semiconductor chip 1b is mounted onto a semiconductor chip 200 by the face-down method. The semiconductor chip 200 is provided with bumps 21 similar to the bumps of the semiconductor chip 1b. Specifically, the mounting is carried out by fluxless bonding.

Figure 9A:
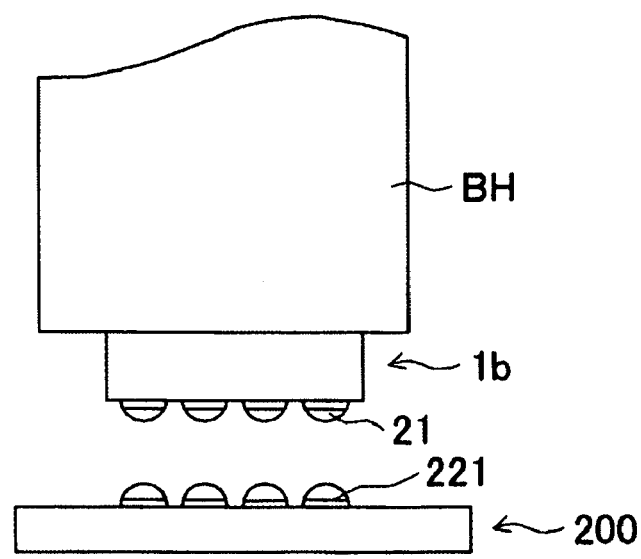
FIGS. 9A to 9C are side views showing the states where a semiconductor chip is mounted on the other semiconductor chip in the second embodiment of the present invention.
Figure 9B:
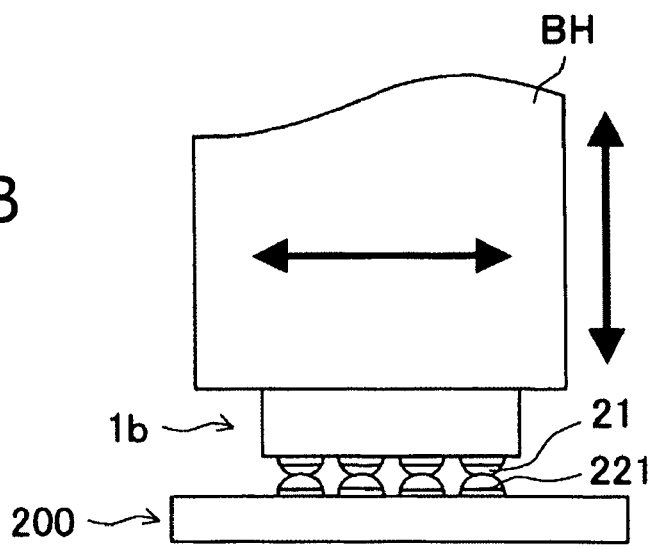
Figure 9C:
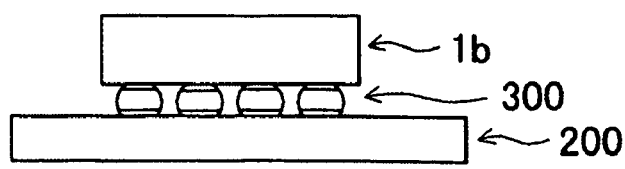

FIGS. 9A to 9C are side views showing the situations where the semiconductor chip 1b is mounted on another semiconductor chip 200 in the second embodiment of the present invention.

The semiconductor chip 1b is installed to a bonding head BH, as shown in FIG. 9A.

That is, the semiconductor chip 1b is installed to the bonding head BH of a bonding apparatus such that a surface of the chip provided with the bump 21 faces down. The semiconductor chip 200, on which the semiconductor chip 1b is to be mounted, is placed with its surface provided with the bump 221 facing upward and facing the surface of the semiconductor chip 1b provided with the pump 21. The semiconductor chip 200 provided with the bump 221 is placed similarly to the above. Subsequently, the bump 21 in the semiconductor chip 1b and the bump 221 in the semiconductor chip 200 are placed such that they correspond with each other by alignment.

Subsequently, the bonding head BH of the bonding apparatus is moved as shown in FIG. 9B.

The bumps 21 and 221 are brought into the molten state by heating the semiconductor chip 1b and the semiconductor chip 200 mounting the semiconductor chip 1b. Specifically, the bumps 21 and 221 are melted by heating these chips to a temperature exceeding 156° C. of the melting point of indium. The bonding head BH is then moved downward such that the semiconductor chip 1b applies pressure against the semiconductor chip 200 for mounting the semiconductor chip 1b. In the present embodiment, both are bonded together in a fluxless bonding process by moving the bonding head BH vertically in the facing direction and/or moving laterally in the planar direction during the period when the solder bumps are in the molten state.

Subsequently, the semiconductor chip 1b is mounted on the semiconductor chip 200, as shown in FIG. 9C.

That is, the bonding between the bump 21 of the semiconductor chip 1b and the bump 221 of the semiconductor chip 200 for mounting the semiconductor chip 1b is carried out by bringing both bumps into the molten state and then by bringing both bumps into contact with each other. As shown in FIG. 9C, the heat treatment is carried out so that all indium of the bump 21 of the semiconductor chip 1b and the bump 221 of the semiconductor chip 200 is alloyed into $In_7Ni_3$, and both bumps are bonded together with an $In_7Ni_3$ layer 300 in between.

Thus, in the present embodiment, after the nickel layer 14 is formed so as to cover the pad electrode 11, the bump 21 is formed correspondingly to the pad electrode 11 covered with the nickel layer 14. In this case, the indium layer 22 is formed on the nickel layer 14. Thereafter, the heat treatment is carried out such that the indium layer 22 and the nickel layer 14 are alloyed into the indium-nickel alloy layer including the $In_7Ni_3$ having a thickness of not less than 1 μm, to be generated as the intermediate metal compound layer 23. Thus, the present embodiment enables the bonding strength to be increased, thereby improving the device's reliability.

Figure 10:
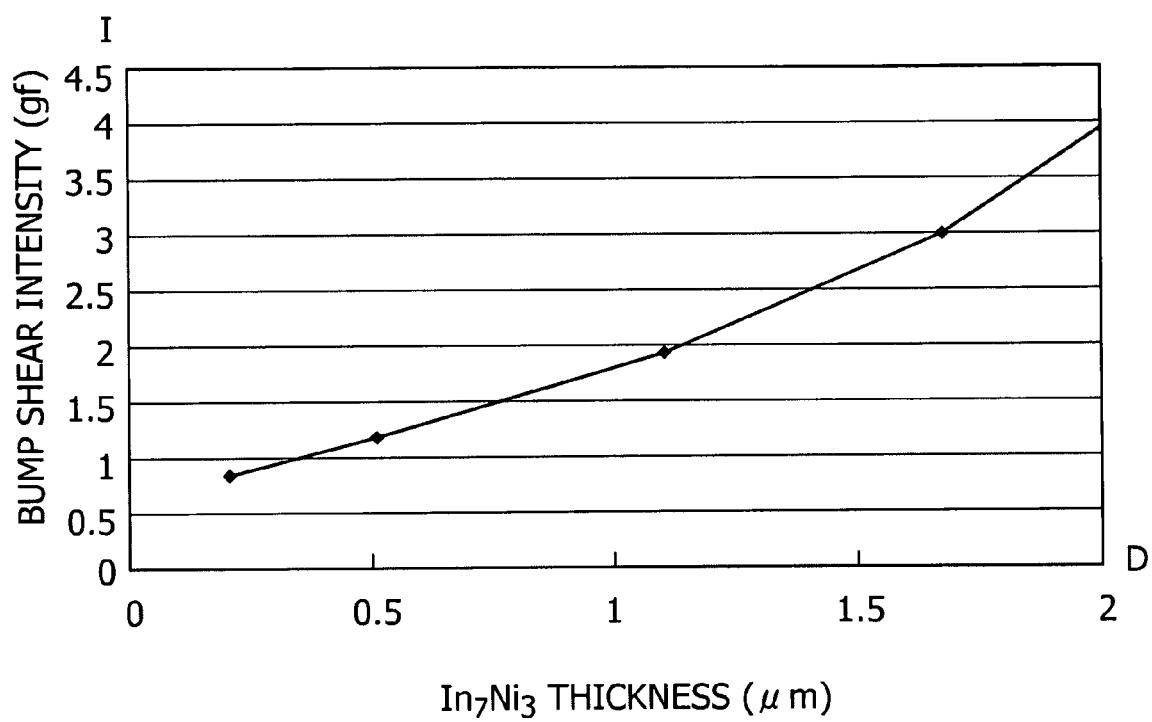
FIG. 10 is a graph showing the relation between the $In_7Ni_3$ thickness and the bump shear intensity in the second embodiment of the present invention.

FIG. 10 is a graph showing the relation between the $In_7Ni_3$ thickness D (μm) and the bump shear intensity (gf) in the second embodiment of the present invention. That is, the position approximately 1 μm above the nickel layer 14 was defined as a shear test position, and the shear intensity of the bump 21 was measured when it was broken under shear force applied to the bump 21 arranged as parallel to the plane at this position.

Figure 11A:
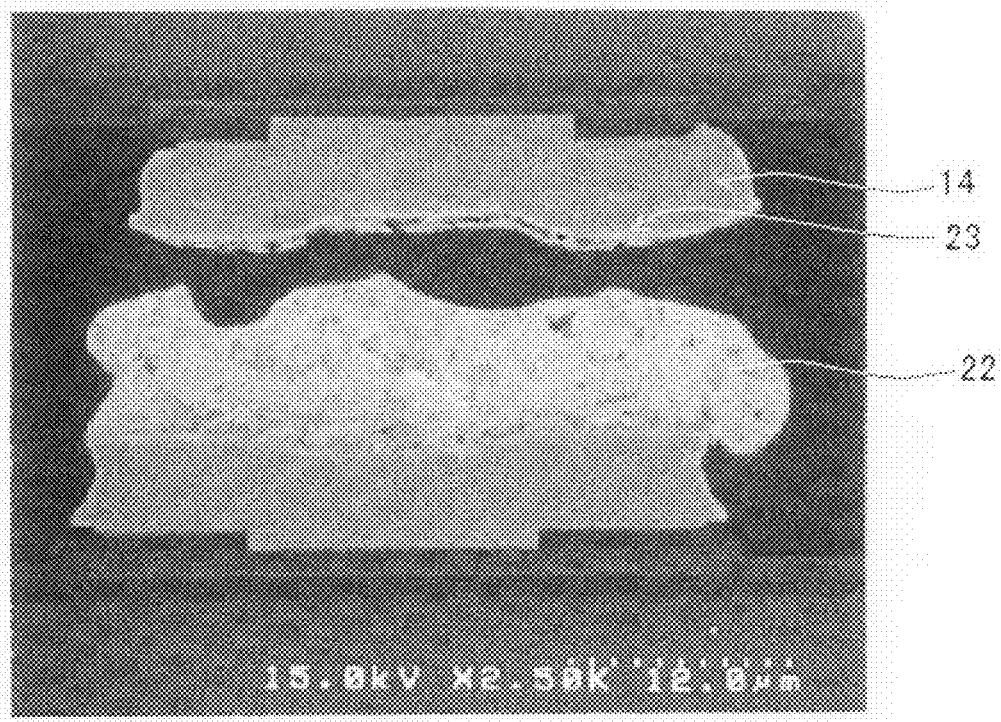
FIGS. 11A and 11B are SEM photographs showing the results of observation of whether indium and nickel are separated from each other in a temperature cycle test in the second embodiment of the present invention.
Figure 11B:
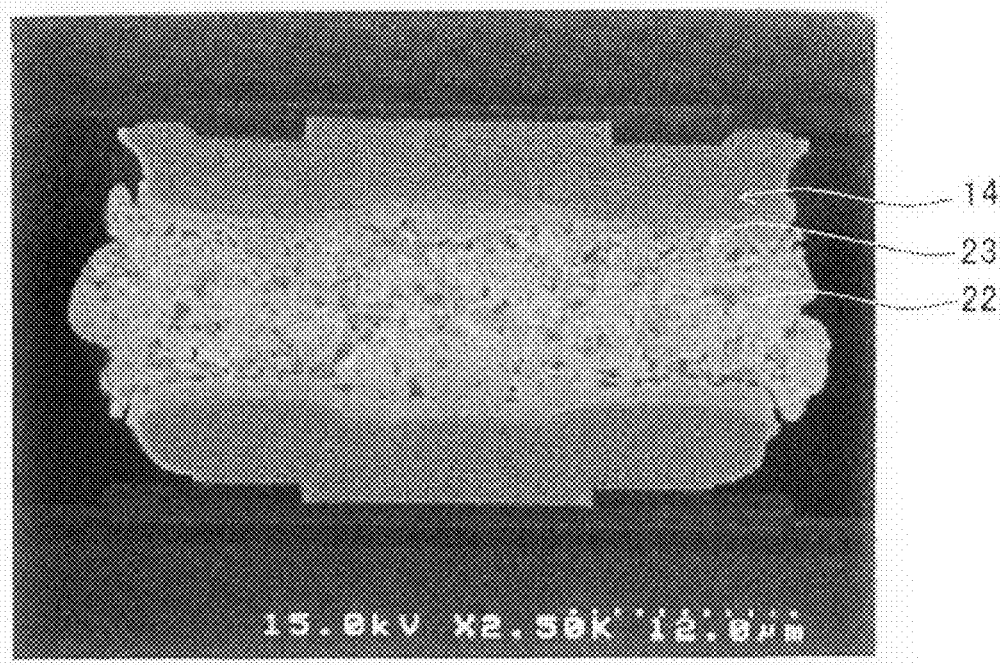

FIGS. 11A and 11B are SEM photographs showing the results of observation of whether indium and nickel are separated from each other in a temperature cycle test conducted in the second embodiment of the present invention. Specifically, FIG. 11A shows the result when the $In_7Ni_3$ has a thickness D of 0.2 μm, and FIG. 11B shows the result when the $In_7Ni_3$ has a thickness D of 1.0 μm.

When the $In_7Ni_3$ has a thickness D of 0.2 μm, the bump shear intensity is small, as shown in FIG. 10. As a result, a separation occurs in the intermediate metal compound layer 23 disposed between the indium layer 22 and the nickel layer 14, thereby causing poor bonding, as shown in FIG. 11A. On the other hand, when the $In_7Ni_3$ has a thickness D of 1.0 μm, the bump shear intensity is increased, as shown in FIG. 10. As a result, no separation occurs in the intermediate metal compound layer 23 disposed between the indium layer 22 and the nickel layer 14, and no poor bonding is caused, as shown in FIG. 11B. That is, the $In_7Ni_3$ having a thickness D of not less than 1.0 μm ensures excellent bonding properties, as shown in FIG. 11B. From this reason, it is found that the separation between indium and nickel may be prevented by the $In_7Ni_3$ having a thickness of not less than 0.3 μm, preferably not less than 0.5 μm, and more preferably not less than 1.0 μm.

Thus, in the present embodiment, the intermediate metal compound layer 23 is generated by alloying into the indium-nickel alloy layer including the $In_7Ni_3$ having a thickness of not less than 1 μm. It is therefore possible to prevent a crack in the intermediate metal compound layer 23 when the semiconductor chip 1b is mounted by the face-down method.

In the present embodiment, the $In_7Ni_3$ as the indium-nickel alloy grown by heat treatment can increase the bonding intensity between indium and indium-nickel. This makes it possible to prevent the separation between the indium and the indium-nickel alloy at the time of fluxless bonding, thereby achieving a high yield bonding.

Additionally, in the present embodiment, after the reflow, the heat treatment is carried out so that the indium layer 22 and the nickel layer 14 are further alloyed to generate the $In_7Ni_3$. The heat treatment is carried out in a temperature ranging from 156° C. or above to below 400° C. It is therefore easy to manufacture devices capable of realizing a high reliability.

Figure 12:
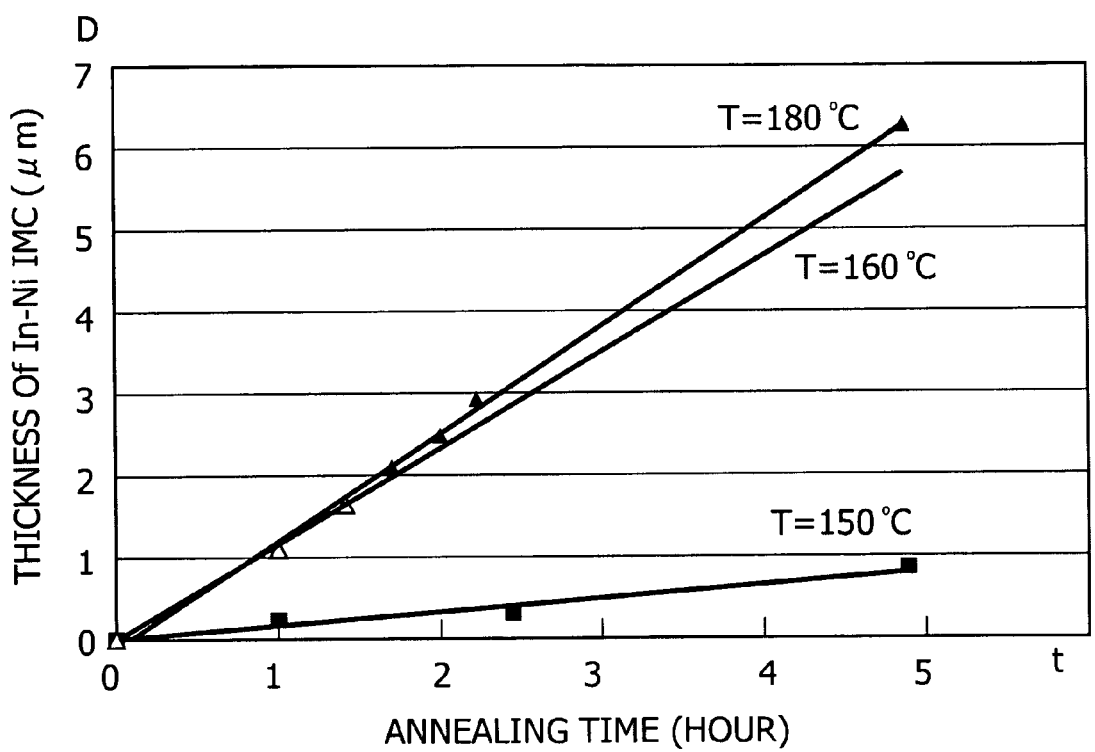
FIG. 12 is a graph showing the relation between heat treatment conditions, such as the heat treatment temperature and time, and the $In_7Ni_3$ thickness generated under the heat treatment conditions, in the second embodiment of the present invention.

FIG. 12 is a graph showing the relation between heat treatment conditions, such as heat treatment temperature T and heat treatment time t, and a thickness D of the $In_7Ni_3$ under the heat treatment conditions, in the second embodiment of the present invention.

Figure 13:
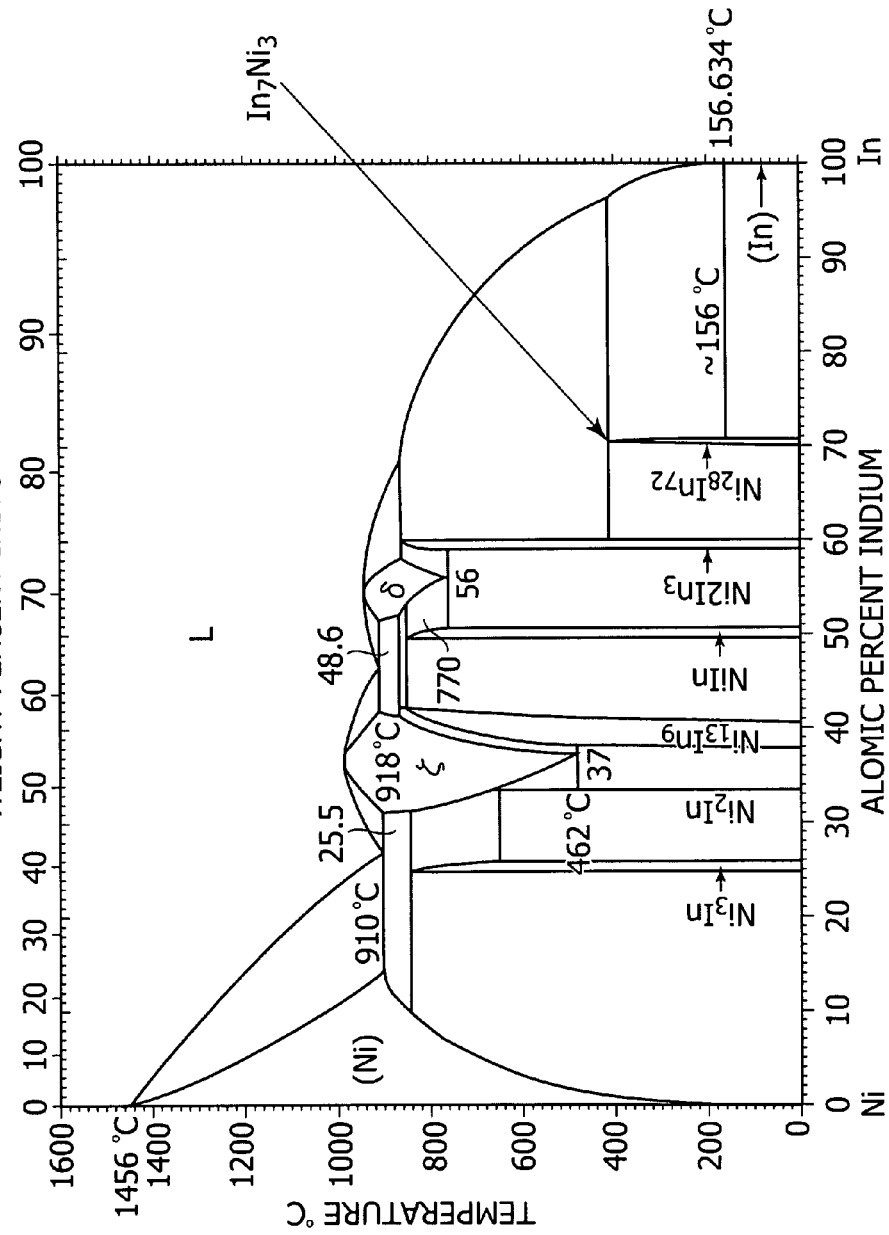
FIG. 13 is a phase diagram of indium and nickel to be alloyed in the second embodiment of the present invention.
Figure 14:
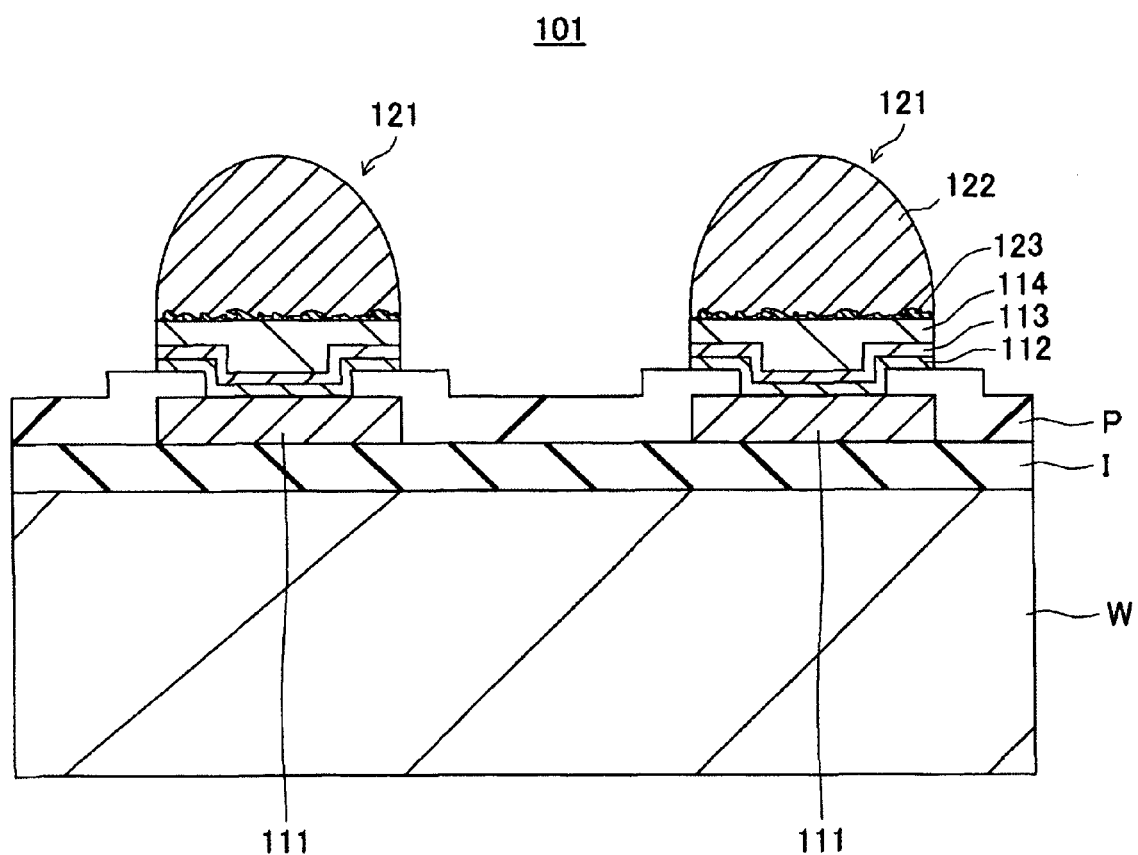
FIG. 14 is a sectional view showing parts of a semiconductor chip in which a bump is formed on a pad electrode.

FIG. 13 is a phase diagram of indium and nickel to be alloyed in the second embodiment of the present invention. This phase diagram is cited from Ph. Durussel et al., "The binary system Ni—In," Journal of Alloys and Compounds 257, pp. 253-258.

As shown in FIG. 12, the heat treatment at 160° C. or 180° C., above the melting point of indium, increases the generating speed of the $In_7Ni_3$, compared with a case where the heat treatment is performed at 150° C., which is below the melting point of indium. Specifically, when the heat treatment is performed at a temperature which is not less than the melting point of indium, the $In_7Ni_3$ having a thickness of 1 μm was produced by the heat treatment for approximately one hour. On the other hand, when the heat treatment is performed at a temperature which is less than the melting point of indium, the $In_7Ni_3$ having a thickness of 1 μm was produced by the heat treatment for approximately 24 hours. Hence, the present embodiment can effectively generate the $In_7Ni_3$ because the heat treatment is performed at a temperature at 156° C., which is the melting point of indium, or above.

As shown in the phase diagram of FIG. 13, when the heat treatment is performed at a temperature of 400° C. or above, the $In_7Ni_3$ is melted again, and when the remelted $In_7Ni_3$ is cooled, an In—Ni alloy having a complicated composition is generated. In this case, the reliability may be deteriorated due to Kirkendall voids caused by the difference in coefficient of linear expansion. However, the present embodiment can prevent the occurrence of the disadvantage because the $In_7Ni_3$ may be suitably produced by heat treatment at a temperature below 400° C.

In the present embodiment, the intermediate metal compound layer 23, composed of $In_7Ni_3$ can be formed in a thickness effective to exhibit a suitable bump shear intensity. It is therefore possible to prevent a crack in the intermediate metal compound layer 23 when the semiconductor chip 1b thus manufactured is mounted by the face-down method.

Hence, the present embodiment can improve the reliability of a semiconductor device manufactured by mounting a semiconductor chip 1b on a wiring board.

The present embodiment is preferred, particularly because the effect is attainable even under heat treatment conditions as low as 200° C. or below. Additionally, the thickness of the $In_7Ni_3$ may be controlled easily by adjusting the heat treatment temperature and time. This is effective in preventing variations of the alloy composition and the thickness due to the complication of process.

While the present invention has been described by the foregoing embodiments, it is to be understood that the present invention is not limited to the embodiments, and various modifications may be made.

Although descriptions are given for the cases of bonding between the semiconductor chips in the embodiments, both provided with an indium solder bump, the present invention is not limited to those cases. The present invention is applicable even if indium solder bumps are formed to either one of the semiconductor chips.

It should be understood by those skilled in the art that various modifications, combinations, subcombinations and alterations may occur depending on design requirements and other factors insofar as they are within the scope of the appended claims or the equivalents thereof.

The present document contains subject matter related to Japanese Patent Application No. 2007-122156 filed in the Japanese Patent Office on May 7, 2007, the entire content of which are incorporated herein by reference.

The invention claimed is:

1. A semiconductor chip formed with a bump such that the bump corresponds to a pad electrode, wherein;
    the pad electrode is covered with a layer consisting of nickel;
    the bump has a layer consisting of indium and an intermediate metal compound layer disposed between the layer consisting of indium and the layer consisting of nickel; and
    the intermediate metal compound layer is formed by alloying the layer consisting of indium and a layer consisting of copper containing copper atoms of not less than 0.5 atomic percent and not more than 5 atomic percent with respect to the indium atoms in the layer consisting of indium.

2. The semiconductor chip according to claim 1, wherein the layer consisting of nickel is formed to be 0.5 μm thick or below on the pad electrode.

* * * * *